US008415806B2

(12) United States Patent
Zhu

(10) Patent No.: US 8,415,806 B2
(45) Date of Patent: Apr. 9, 2013

(54) SEMICONDUCTOR STRUCTURE AND METHOD FOR MANUFACTURING THE SAME

(75) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/142,631

(22) PCT Filed: Feb. 24, 2011

(86) PCT No.: PCT/CN2011/000290
§ 371 (c)(1),
(2), (4) Date: Jun. 29, 2011

(87) PCT Pub. No.: WO2011/160419
PCT Pub. Date: Dec. 29, 2011

(65) Prior Publication Data
US 2012/0056323 A1  Mar. 8, 2012

(30) Foreign Application Priority Data

Jun. 22, 2010  (CN) .......................... 2010 1 0215093

(51) Int. Cl.
*H01L 23/48*  (2006.01)
(52) U.S. Cl. . 257/774; 257/751; 257/773; 257/E21.577; 257/E21.584; 257/E21.585; 257/E21.597; 438/629; 438/637; 438/672; 438/675
(58) Field of Classification Search .................. 257/774, 257/698, E21.597, 751, 773, E21.577, E21.584, 257/E21.585; 438/630, 637–640, 668, 672, 438/675, 629
See application file for complete search history.

(56) References Cited

U.S. PATENT DOCUMENTS

| 5,229,647 | A * | 7/1993 | Gnadinger ............... 257/785 |
| 6,716,737 | B2 * | 4/2004 | Plas et al. ............... 438/612 |
| 6,720,661 | B2 * | 4/2004 | Hanaoka et al. ......... 257/774 |
| 6,831,367 | B2 * | 12/2004 | Sekine ................... 257/774 |
| 2009/0039527 | A1 | 2/2009 | Chan et al. |
| 2009/0294911 | A1 | 12/2009 | Pagaila et al. |

FOREIGN PATENT DOCUMENTS

| CN | 101197297 | 6/2008 |
| CN | 101330067 A | 12/2008 |
| CN | 101335261 A | 12/2008 |
| JP | 2010103195 | 5/2010 |

OTHER PUBLICATIONS

International Search Report dated Apr. 18, 2011 for a related PCT Application No. PCT/CN2011/000290.

* cited by examiner

*Primary Examiner* — Jasmine Clark
(74) *Attorney, Agent, or Firm* — Troutman Sanders LLP

(57) ABSTRACT

The application discloses a semiconductor structure and a method for manufacturing the same. The semiconductor structure comprises: a semiconductor substrate comprising a first surface and a second surface opposite to each other; and a silicon via formed through the semiconductor substrate, wherein the silicon via comprises a first via formed through the first surface; and a second via formed through the second surface and electrically connected with the first via, wherein the first and second vias are formed individually. Embodiments of the invention are applicable to the manufacture of a 3D integrated circuit.

14 Claims, 7 Drawing Sheets

SEMICONDUCTOR STRUCTURE AND METHOD FOR MANUFACTURING THE SAME

This application is a Section 371 National Stage Application of, and claims priority to, International Application No. PCT/CN2011/000290, filed on Feb. 24, 2011, which claimed priority to Chinese Application No. 201010215093.1, filed on Jun. 22, 2010. Both the International Application and Chinese Application are incorporated herein by reference in their entireties.

FIELD OF THE INVENTION

The invention relates to the field of semiconductor manufacturing, and in particular, to a semiconductor structure with a dual-silicon-via structure and a method for manufacturing the same.

BACKGROUND OF THE INVENTION

With the development of integrated circuits, the size of a semiconductor device is becoming increasingly smaller, and it is a trend of mainstream in the semiconductor industry to integrate more devices on a smaller chip.

In a 3D integrated circuit, it is necessary to make a connection or interconnection between semiconductor chips, and for increasingly smaller chips, the process of interconnecting chips becomes difficult. A conventional process of interconnecting chips is generally performed in such a manner: firstly, as shown in FIG. 1, a silicon via 200 is formed in the upper surface of a semiconductor chip 100 on which a semiconductor device 300 may be already formed; the silicon via is then connected with the semiconductor device 300 or local interconnection of the semiconductor device 300 by an interconnecting structure 400; then, as shown in FIG. 2, the semiconductor chip 100 as a whole is flipped, and the lower surface thereof is thinned by grinding to expose the silicon via 200; finally, an interconnection may be performed between the exposed silicon via and silicon vias of other chips so as to accomplish the interconnection between chips.

The use of such a process usually needs to thin the semiconductor chip to a thickness below 150 µm, which brings about severe requirements for both the process and the cost.

In view of this, it is necessary to provide a new semiconductor structure and a method for manufacturing the same to simplify the process flow and save the cost.

SUMMARY OF THE INVENTION

It is an object of the invention to provide a semiconductor structure and a method for manufacturing the same to overcome the above mentioned problems.

According to an aspect of the invention, there is provided a semiconductor structure, comprising: a semiconductor substrate comprising a first surface and a second surface opposite to each other; and a silicon via formed through the semiconductor substrate, wherein the silicon via comprises a first via formed through the first surface and a second via formed through the second surface and electrically connected with the first via, and the first and second vias are formed individually.

Preferably, the first via may comprise a first through hole; a first insulating layer covering sidewalls of the first through hole; a first barrier layer formed on inner walls of the first insulating layer; and a first conductive plug formed in a space surrounded by the first barrier layer.

Preferably, the second via comprises a second through hole; a through-hole spacer formed on sidewalls of the second through hole; a second barrier layer formed at the bottom of the second through hole and on the inner walls of the through-hole spacer; and a second conductive plug formed in a space surrounded by the second barrier layer.

Moreover, the second conductive layer is electrically connected with the first conductive layer.

The through-hole spacer may be formed of an oxide or nitride. The second barrier layer may comprise any one of or a combination of more than one of TaN, TiN, Ta, Ti, TiSiN, TaSiN, TiW, WN and Ru.

Preferably, the semiconductor structure further comprises a second insulating layer surrounding the second via and formed on the second surface.

According to another aspect of the invention, there is provided a method for manufacturing a semiconductor structure, comprising: providing a semiconductor substrate and forming a silicon via through the semiconductor substrate, wherein the provided semiconductor substrate comprises a first surface and a second surface opposite to each other.

In particular, the formation of the silicon via comprises forming a first via through the first surface; and forming a second via through the second surface, the first via being electrically connected with the second via.

In particular, the formation of the first via may comprise forming a first through hole through the first surface; forming a first insulating layer to cover sidewalls of the first through hole; forming a first barrier layer to cover sidewalls of the first insulating layer; and forming a first metal plug in the first barrier layer.

In particular, the formation of the second via may comprise forming a second through hole through the second surface; forming a through-hole spacer to cover sidewalls of the second through hole; forming a second barrier layer at the bottom of the second through hole and on the inner walls of the through-hole spacer; and forming a second metal plug in the second barrier layer.

Preferably, in an embodiment of the invention, the method further comprises the step of forming a second insulating layer on the second surface before the formation of the second through hole through the second surface. Therefore, the step of forming a second through hole through the second surface particularly involves forming the second through hole through the second insulating layer and the second surface.

In the above solutions, preferably, at least one of the first via and the second via is connected to an integrated circuit.

According to a semiconductor structure and a method for manufacturing the same provided by an embodiment of the invention, the silicon via is formed with two parts. In addition to a first via formed by a method for forming a conventional silicon via, a second via is further formed through the second surface of the substrate. In an embodiment of the invention, there is no need to thin the semiconductor substrate by grinding, thereby saving the process and cost and ensuring the yield.

BRIEF DESCRIPTION OF THE DRAWINGS

The above and other objects, features and advantages of the invention will be more apparent from the following description of embodiments of the invention with reference to the accompanying drawings in which.

DETAILED DESCRIPTION OF THE INVENTION

Figure 1:
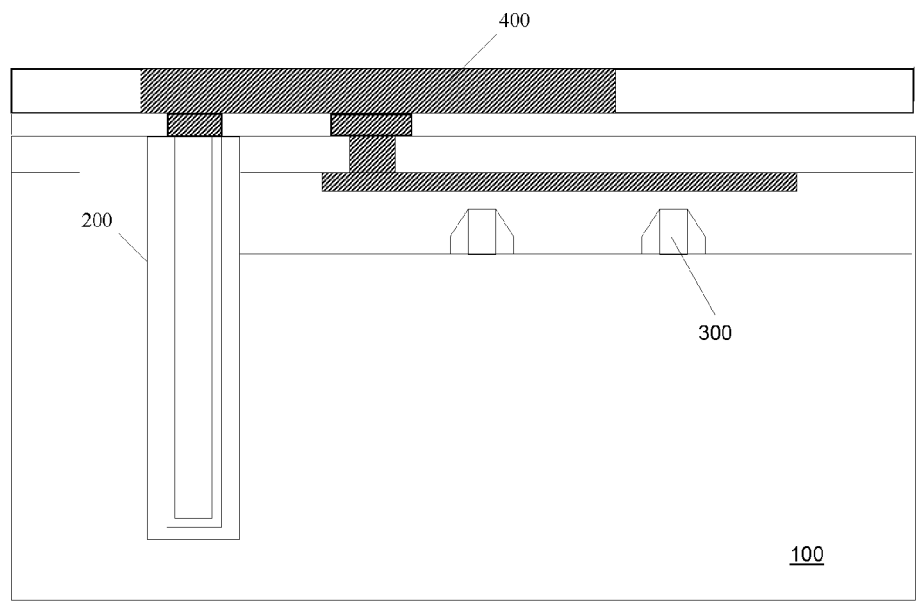
FIGS. 1-2 show a schematic view of the process of forming a silicon via in the prior art.
Figure 2:
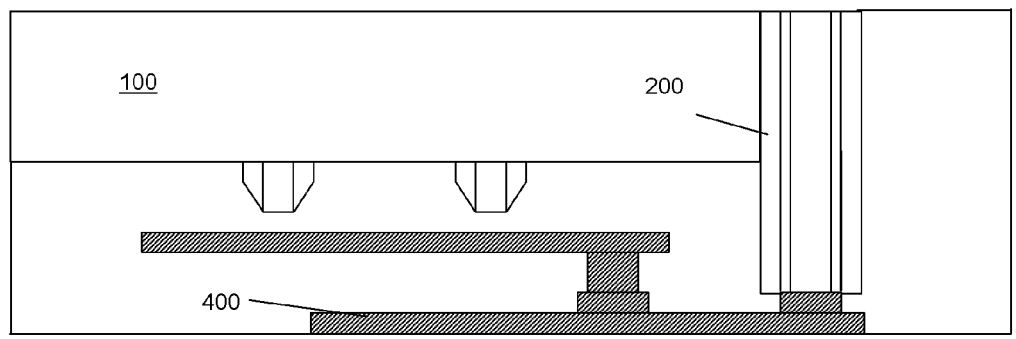

In the following, the invention is described by embodiments shown in the drawings. However, it should be understood that such a description is just exemplary and not intended to limit the scope of the invention. Furthermore, in the following explanation, the description of a well-known structure and technique is omitted to avoid an unnecessary confusion of the concept of the invention.

A schematic view of a laminate structure according to an embodiment of the invention is shown in the drawings. These drawings are not drawn to scale, in which some details are amplified and some details may be omitted for the purpose of clarity. The shapes of various regions, layers and the relative size and position relationship between them are simply exemplary, there may be a certain deviation due to the manufacture tolerance or technical limitation in practice, and those skilled in the art may further design a region/layer having a different shape, size and relative position as desired.

FIGS. 3-11 show in detail cross-sectional views of each step in the procedure of manufacturing a semiconductor structure according to an embodiment of the invention. In the following, each step according to an embodiment of the invention and the resulting semiconductor structure will be described in detail with reference to the figures.

Figure 3:
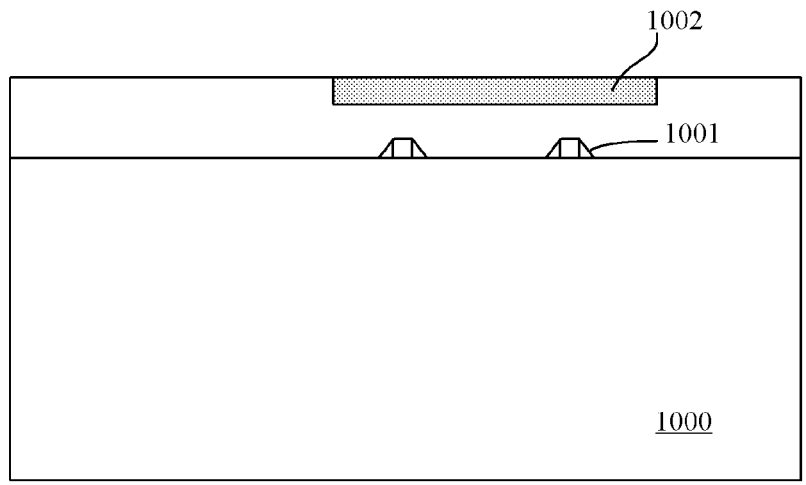
FIGS. 3-11 show structural cross-sectional views of each step in the procedure of manufacturing a semiconductor structure according to an embodiment of the invention.

Firstly, as shown in FIG. 3, a semiconductor substrate 1000 is provided. The semiconductor substrate 1000 may comprise any suitable semiconductor substrate material, which in particular may be, but not limited to, Si, Ge, SiGe, SOI (silicon on an insulator), SiC, GaAs, or any III/V group compound semiconductor, etc. According to the design requirements known in the prior art (for example, for a p-type substrate or n-type substrate), the semiconductor substrate 1000 may comprise various doping configurations. Furthermore, the semiconductor substrate 1000 may optionally comprise an epitaxial layer which may be strained to enhance performance. Further, a semiconductor device and a local interconnecting structure of the device, etc. may be formed on the semiconductor substrate 1000.

In an embodiment of the invention, a semiconductor device 1001 and a BEOL (Back-end-of-line) interconnecting structure 1002 are formed on the semiconductor substrate 1000. Such structures are formed in an insulating layer 1003 on the semiconductor substrate 1000, and the insulating layer may be formed of a material such as oxide, nitride, phosphosilicate glass, or other material.

For facilitating the description in the following, the upper surface shown in FIG. 3 is referred to as the first surface of the semiconductor substrate, and the lower surface is referred to as the second surface of the semiconductor substrate. In the subsequent processes, such an appellation will be used even if the semiconductor substrate is flipped.

Figure 4:
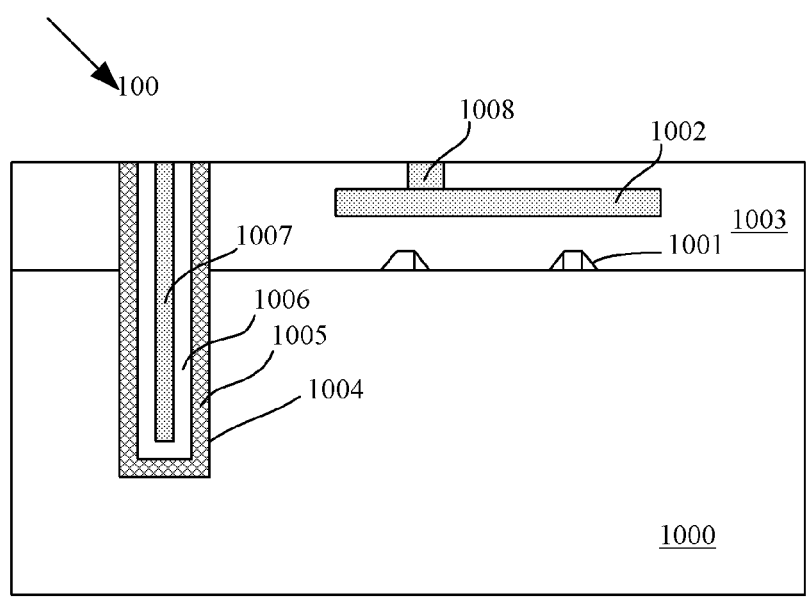

As shown in FIG. 4, a first via 100 is formed in the semiconductor substrate 1000. In particular, a further insulating layer (not shown in the figure), such as $SiO_2$ or other interlayer dielectric material, may firstly be deposited on the first surface. The formation of such an insulating layer is a conventional technique known to those skilled in the art. Then, the semiconductor substrate is etched from the first surface to form a first through hole 1004 in FIG. 4. In the method for etching, a photoresist mask may be used to cover the remaining portions and an anisotropic dry etching is applied. Next, a first insulating layer 1005 is formed on sidewalls of the first through hole 1004. The material of which the first insulating layer 1005 is formed may be oxide, nitride, or other material, and $SiO_2$ is used in an embodiment of the invention. Then, a first bather layer 1006 may further be formed on inner walls of the first insulating layer 1005. The material for the barrier layer may comprise one or a combination of more than one of TaN, TiN, Ta, Ti, TiSiN, TaSiN, TiW, WN, or Ru. The barrier layer serves to prevent atoms in a conductive plug from diffusing, thereby avoiding the deterioration of the performance of the device. Finally, a first conductive plug 1007 is formed in a space surrounded by the first barrier layer 1006. The first conductive plug 1007 may be formed of a material such as W, Co, Ni, or Cu, etc. In the end, it is required to perform a CMP (Chemical Mechanical Polish) process on the first surface. Thus, the first via 100 is formed, the method for forming which is the same as a conventional method for forming a silicon via. Herein, the method for forming the first insulating layer 1005, the first barrier layer 1006, and the first conductive plug 1007 may be a conventional method such as chemical vapor deposition, molecular beam deposition, atomic vapor deposition, sputtering, or other methods.

As shown in FIG. 4, in a general process, while the first via 100 is formed, a further interconnecting structure 1008 is formed, which is electrically connected with the BEOL interconnecting structure 1002.

Figure 5:
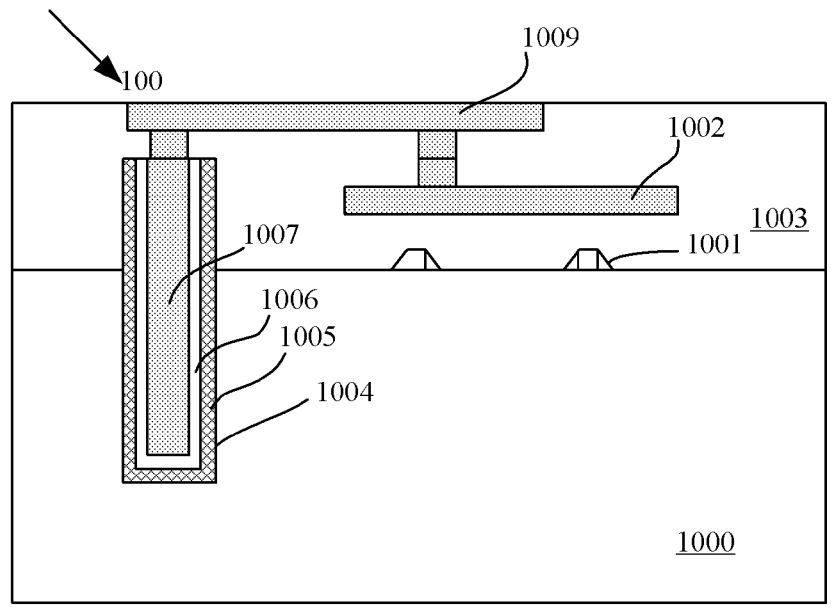

Next, as shown in FIG. 5, the first via 100 is further interconnected with the interconnecting structure 1008 by a further interconnecting structure 1009. In the procedure of forming the interconnection, an insulating layer (not shown in the figure) may further be formed on the upper surface of the semiconductor substrate 1000.

Figure 6:
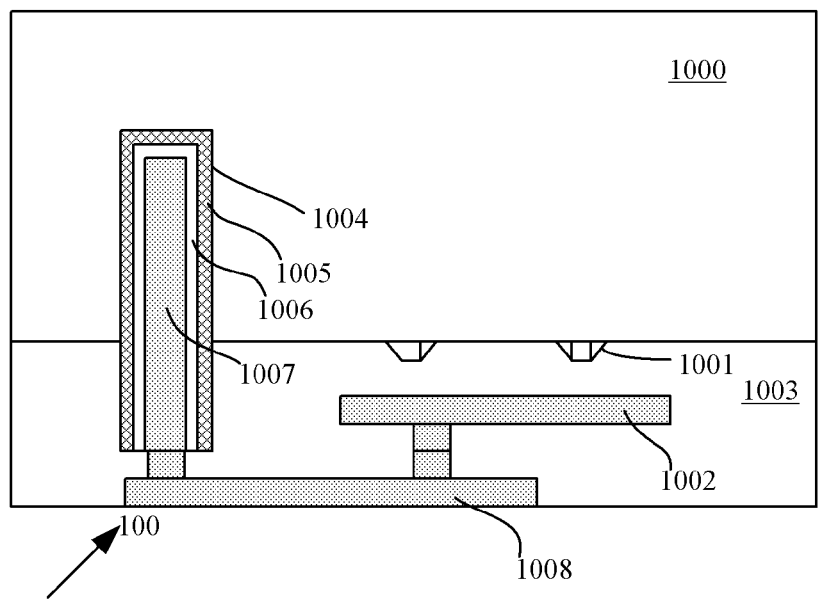

As shown in FIG. 6, the semiconductor substrate 1000 is flipped to bring the second surface upward.

Figure 7:
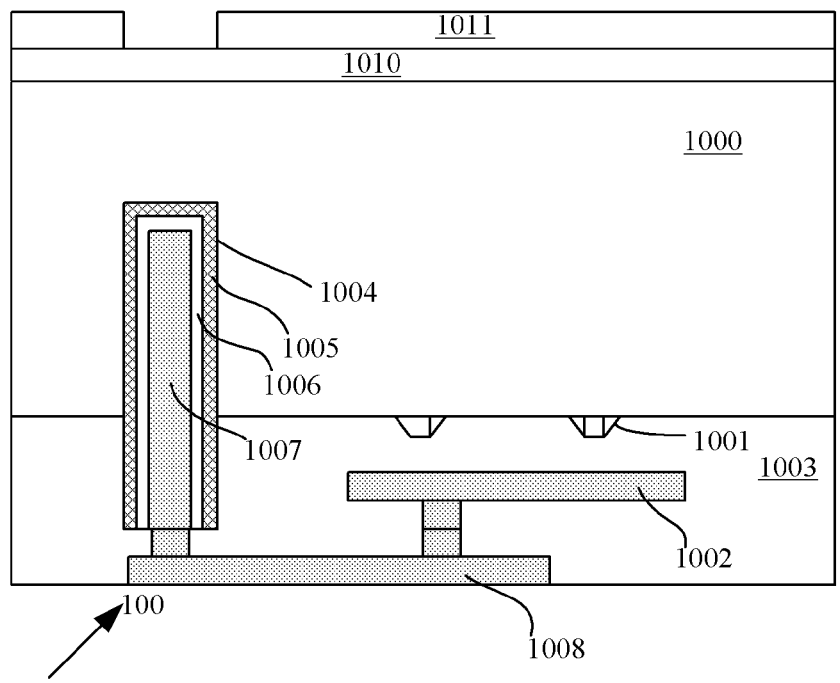

Next, as shown in FIG. 7, a second insulating layer 1010 may be formed on the second surface, and the material for the second insulating layer may be oxide, nitride, or other dielectric material. In an embodiment of the invention, $SiO_2$ is selected as the material for the second insulating layer 1010, which may be formed by deposition or thermal oxidation. Next, a layer of photoresist is coated on the second insulating layer 1010, and the photoresist is patterned according to the shape of the first via 100, thereby forming a patterned photoresist 1011.

Figure 8:
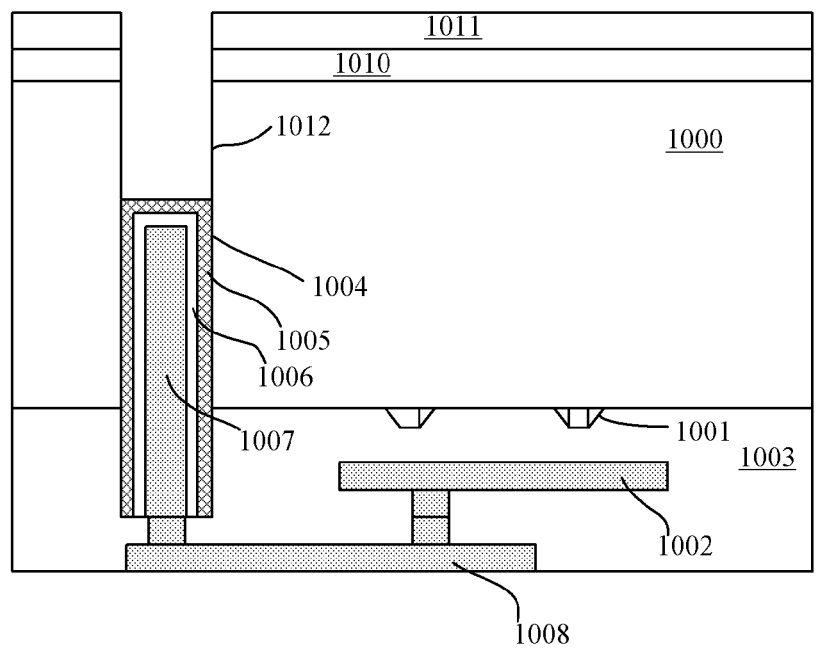

As shown in FIG. 8, by using the patterned photoresist 1011 as a mask, the semiconductor substrate is etched from the insulating layer 1010 on the second surface, so as to form a second through hole 1012. Next, the photoresist 1011 is removed.

Figure 9:
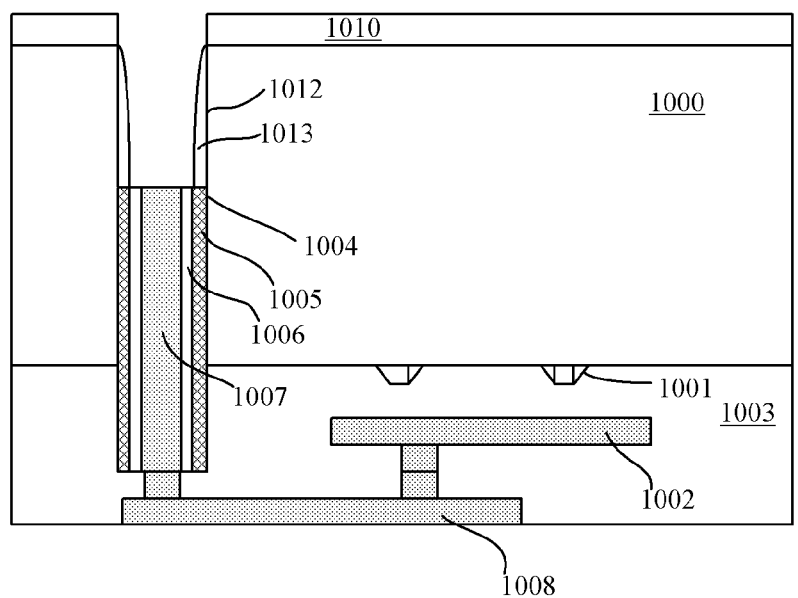

As shown in FIG. 9, a through-hole spacer 1013 is formed in the second through hole 1012. In particular, a layer of oxide, nitride, or other dielectric material may firstly be deposited in the through hole, the thickness of which may be 5-50 nm, and $SiO_2$ is used in an embodiment of the invention. Next, an RIE (Reactive Ion Etching) process is applied, such that the layer of $SiO_2$ forms the through-hole spacer 1013 in the second through hole 1012.

Figure 10:
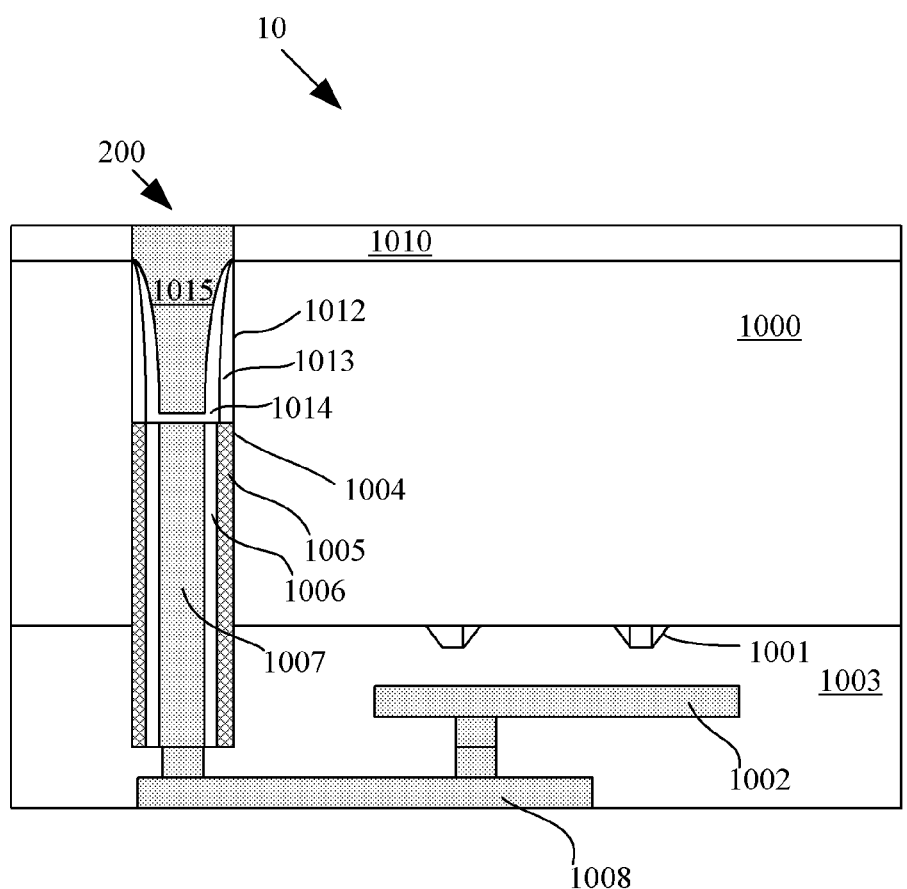

Next, as shown in FIG. 10, after the formation of the through-hole spacer 1013, a second barrier layer 1014 is formed on the inner walls of the through-hole spacer and at the bottom of the second through hole 1012. This barrier layer is also used for blocking metal atoms from diffusing into other parts of the semiconductor structure (e.g., the semiconductor device, etc.) to affect the performance of the device, e.g. to incur the occurrence of a short, etc. The material of the second barrier layer 1014 may comprise one or a combination of more than one of TaN, TiN, Ta, Ti, TiSiN, TaSiN, TiW, WN, or Ru. Then, a second conductive plug 1015 is formed by deposition in a space formed by the second barrier layer 1014. For example, the second conductive plug may be formed by using a process such as deposition, sputtering, etc. The second conductive plug 1015 may be formed of a material such as W, Co, Ni, or Cu, etc. Finally, the second surface of the semiconductor substrate is processed by CMP to form a second via 200 as shown in FIG. 10. Moreover, the second via 200 is connected with the conductive material of the first via 100, thereby forming an electrical connection.

So far, a semiconductor structure 10 according to an embodiment of the invention is completed. As shown in FIG. 10, the semiconductor structure 10 comprises a semiconductor substrate 1000 and a silicon via. The semiconductor substrate 1000 comprises a first surface and a second surface opposite to each other. The silicon via is formed through the semiconductor substrate 1000, wherein the silicon via comprises a first via 100 formed through the first surface and a second via 200 formed through the second surface and electrically connected with the first via.

Preferably, the first via 100 may comprise a first through hole 1004, a first insulating layer 1005, a first barrier layer 1006, and a first conductive plug 1007. The first through hole 1004 is formed through the first surface, the first insulating layer 1005 is formed to cover the sidewalls of the first through hole 1004, the first barrier layer 1006 covers the sidewalls of the first insulating layer 1005, and the first conductive plug 1007 is formed in a space formed by the first barrier layer 1006. The first conductive plug 1007 and the first barrier layer 1006 together form a first conductive layer. The first conductive layer may also be formed only by the first metal plug 1007.

Preferably, the second via 200 comprises a second through hole 1012, a through-hole spacer 1013, a second barrier layer 1014, and a second conductive plug 1015. The second through hole 1012 is formed through the second surface, the through-hole spacer 1013 is formed on the sidewalls of the second through hole 1012, the second barrier layer 1014 is formed at the bottom of the second through hole 1012 and on the inner walls of the through-hole spacer 1013, and the second conductive plug 1015 is formed in a space surrounded by the second barrier layer 1014. Moreover, the second conductive plug 1015 is electrically connected with the first conductive plug 1007. The second conductive plug 1015 and the second barrier layer 1014 together form a second conductive layer. The second conductive layer may also be formed only by the second conductive plug 1015.

Herein, the material of the first barrier layer 1006 and the second barrier layer 1014 may comprise one or a combination of more than one of TaN, TiN, Ta, Ti, TiSiN, TaSiN, TiW, WN, or Ru, and is capable of preventing atoms diffusion from a conductive material.

The through-hole spacer 1013 may be formed of oxide or nitride.

Preferably, the semiconductor structure further comprises a second insulating layer 1010 formed on the second surface to surround the second via 200.

In the above solutions, preferably at least one of the first via and the second via is connected with other integrated circuits. For example, the integrated circuit consisting of the semiconductor device 1001 and the interconnecting structure 1002 is interconnected with the first via by the interconnecting structure 1008.

In order to connect the structure shown in FIG. 10 with other semiconductor chips or structures to form a 3D integrated circuit, or to supply power or perform input/output (I/O) of an external signal to the formed 3D integrated circuit, it is needed to electrically connect the corresponding silicon via of the semiconductor structure with the silicon via of other semiconductor chips or structures.

Figure 11:
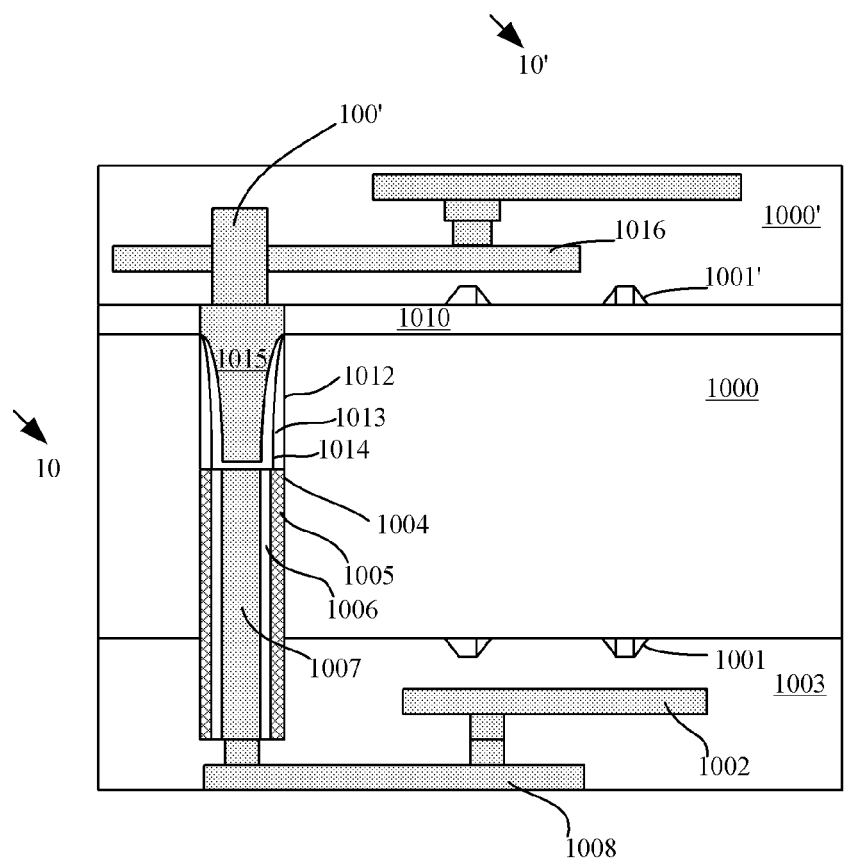

As shown in FIG. 11, a further semiconductor structure 10' is connected with the semiconductor structure 10. The further semiconductor structure 10' may comprise a semiconductor device 1001' and a silicon via 100', etc. which are corresponding to those of semiconductor structure 10. The two semiconductor structures may be interconnected by an interconnecting structure 1016, thereby forming a 3D integrated circuit.

Optionally, a dual-silicon-via structure shown in embodiments of the invention may also be formed on the further semiconductor structure 10', for example, a first via 100' and a second via 200' may be comprised. There is no limitation to this in embodiments of the invention.

According to an embodiment of the invention, the first via is formed in one surface of the semiconductor substrate, and then the second via is formed in the other surface of the semiconductor substrate, thereby forming a dual-silicon-via structure. There is no need to thin the semiconductor substrate by grinding in such a method. Therefore, the process is simple, and thus the procedure and the cost can be saved.

In the above description, the technical details such as the patterning, etching, etc. of the layers have not been illustrated in detail. However, it will be understood by those skilled in the art that a layer, region, etc. with a desired shape may be formed by various known means. Furthermore, a method not exactly identical to the method described above may also be designed by those skilled in the art to form an identical structure.

While the invention has been described with reference to the embodiments of the invention, these embodiments are only for the purpose of illustration, and not for limitation to the scope of the invention. The scope of the invention is defined by the appended claims and the equivalent thereof. Many alternatives and modifications may be made by those skilled in the art without departing from the scope of the invention, which alternatives and modifications should fall within the scope of the invention.

What is claimed is:

1. A semiconductor structure, comprising:
a semiconductor substrate comprising a first surface and a second surface opposite to each other; and
a silicon via formed through the semiconductor substrate, wherein the silicon via comprises a first via formed through the first surface and a second via formed through the second surface and electrically connected with the first via, and the first and second vias are formed individually; and
wherein the first via comprises a first through hole; a first insulating layer covering sidewalls of the first through hole; and a first conductive layer formed in a space surrounded by the first insulating layer.

2. The semiconductor structure according to claim 1, wherein the first conductive layer comprises a first barrier layer formed on inner walls of the first insulating layer, and a first conductive plug formed in a space surrounded by the first barrier layer.

3. The semiconductor structure according to claim 1, wherein the second via comprises a second through hole; a through-hole spacer formed on sidewalls of the second through hole; and a second conductive layer formed in a space surrounded by the through-hole spacer, the second conductive layer being electrically connected with the first conductive layer.

4. The semiconductor structure according to claim 3, wherein the through-hole spacer is formed of an oxide or nitride.

5. The semiconductor structure according to claim 3, wherein the second conductive layer comprises a second barrier layer formed at the bottom of the second through hole and on the inner walls of the through-hole spacer, and a second conductive plug formed in a space surrounded by the second barrier layer.

6. The semiconductor structure according to claim 3, wherein the second barrier layer comprises any one of or a combination of more than one of TaN, TiN, Ta, Ti, TiSiN, TaSiN, TiW, WN, and Ru.

7. The semiconductor structure according to claim 1, wherein at least one of the first via and the second via is connected to an integrated circuit.

8. The semiconductor structure according claim 1, further comprising a second insulating layer surrounding the second via and formed on the second surface.

9. A method for manufacturing a semiconductor structure, comprising:
provoding a semiconductor substrate comprising a first surface and a second surface opposite to each other; and
forming a silicon via through the semiconductor substrate, the formation of the silicon via comprising forming a first via through the first surface and forming a second via through the second surface,
wherein the first via is electrically connected with the second via; and
wherein the formation of the first via comprises:
forming a first through hole through the first surface;
forming a first insulating layer to cover sidewalls of the first through hole; and
forming a first conductive layer in a space surrounded by the first insulating layer.

10. The method according to claim 9, wherein the formation the first conductive layer comprises:
forming a first barrier layer to cover sidewalls of the first insulating layer; and
forming a first metal plug in the first barrier layer.

11. A method for manufacturing a semiconductor structure, comprising:
providing a semiconductor substrate comprising a first surface and a second surface opposite to each other; and
forming a silicon via through the semiconductor substrate, the formation of the silicon via comprising forming a first via through the first surface and forming a second via through the second surface,
wherein the first via is electrically connected with the second via, wherein the formation of the second via comprises:
forming a second through hole through the second surface;
forming a through-hole spacer to cover sidewalls of the second through hole; and
forming a second conductive layer in a space surrounded by the through-hole spacer.

12. The method according to claim 11, wherein the formation of the second conductive layer comprises:
forming a second barrier layer at the bottom of the second through hole and on the inner walls of the through-hole spacer; and
forming a second metal plug in the second barrier layer.

13. The method according to claim 9, wherein at least one of the first via and the second via is connected to an integrated circuit.

14. The method according to claim 11, prior to the formation of the second through hole through the second surface, further comprising:
forming a second insulating layer on the second surface,
wherein the formation of the second through hole through the second surface comprises forming the second through hole through the second insulating layer and the second surface.

* * * * *